(12) United States Patent
Wang et al.

(10) Patent No.: US 10,897,240 B2
(45) Date of Patent: Jan. 19, 2021

(54) LOW POWER TRANSMITTER OSCILLATOR CIRCUITS AND METHODS

(71) Applicant: THE REGENTS OF THE UNIVERSITY OF CALIFORNIA, Oakland, CA (US)

(72) Inventors: Xiaoyang Wang, La Jolla, CA (US); Patrick Mercier, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/961,471

(22) PCT Filed: Jan. 15, 2019

(86) PCT No.: PCT/US2019/013591
§ 371 (c)(1),
(2) Date: Jul. 10, 2020

(87) PCT Pub. No.: WO2019/140424
PCT Pub. Date: Jul. 18, 2019

(65) Prior Publication Data
US 2020/0382106 A1 Dec. 3, 2020

Related U.S. Application Data

(60) Provisional application No. 62/617,356, filed on Jan. 15, 2018.

(51) Int. Cl.
*H03K 3/012* (2006.01)
*H03K 3/014* (2006.01)
(Continued)

(52) U.S. Cl.
CPC .............. *H03K 3/012* (2013.01); *H03K 3/014* (2013.01); *H03K 3/0231* (2013.01); *H03K 5/08* (2013.01);
(Continued)

(58) Field of Classification Search
None
See application file for complete search history.

(56) References Cited

U.S. PATENT DOCUMENTS 6,057,742 A  5/2000 Prado
6,937,487 B1  8/2005 Bron
(Continued)

OTHER PUBLICATIONS

Chen et al., "A Cubic-Millimeter Energy-Autonomous Wireless Intraocular Pressure Monitor", Digest of Technical Papers, Feb. 2011, pp. 309-311, ISSCC 2011, Session 17, IEEE.
(Continued)

*Primary Examiner* — Cassandra F Cox
(74) *Attorney, Agent, or Firm* — Greer, Burns & Crain, Ltd.; Steven P. Fallon (57) ABSTRACT

A fast startup power oscillator transmitter includes a transistor pair that drives a resonant circuit including a tunable capacitance. A capacitor array preferably forms the tunable capacitance. A voltage booster activates the capacitor array. A clamped body bias voltage booster can set the body bias voltage of the transistor pair in one circuit. Control circuitry activates the resonant circuit through a triode-mode switch transistor in response to an input in a range of 0.3-0.6V, and preferably while controlling the substrate bias voltage of the transistor pair to increase transconductance of the cross-coupled transistor pair. In a variation, a circuit pushes a top plate voltage of one of the two capacitors to $2V_{DD}$ and pulls the top plate voltage of the other to zero to give the oscillator an initial condition. In a variation, a shaped pulse drives the transistor pair to switch to a class D oscillator mode, and the triode mode switch transistor is only turned on when the oscillation signal voltage is in the range of 0.3-0.6V.

16 Claims, 11 Drawing Sheets

(51) Int. Cl.
 H03K 5/08 (2006.01)
 H03K 17/687 (2006.01)
 H03K 17/0812 (2006.01)
 H03K 3/0231 (2006.01)
(52) U.S. Cl.
 CPC ....... *H03K 17/0812* (2013.01); *H03K 17/687* (2013.01)

(56) References Cited

U.S. PATENT DOCUMENTS

| | | | |
|---|---|---|---|
| 7,009,458 | B2 | 3/2006 | Gazit |
| 7,034,628 | B1 | 4/2006 | Lu et al. |
| 8,330,549 | B1 | 12/2012 | Chen |
| 2002/0135433 | A1 | 9/2002 | Uchiyama et al. |
| 2016/0276877 | A1* | 9/2016 | Weale ............... H02J 50/80 |
| 2020/0253520 | A1* | 8/2020 | Wang ............... A61B 5/14546 |

OTHER PUBLICATIONS

Yeknami et al., "A 0.3V Biofuel-Cell-Powered Glucose /Lactate Biosensing System Employing a 180nW 64dB SNR Passive ΔΣ ADC and a 920MHz Wireless Transmitter", Digest of Technical Papers, Feb. 2018, pp. 283-285, ISSCC 2018, Session 17, IEEE.

Lee et al., "An Inductively Powered Scalable 32-Channel Wireless Neural Recording System-on-a-Chip for Neuroscience Applications", IEEE Transactions on Biomedical Circuits and Systems, Dec. 2010, pp. 360-371, vol. 4, No. 6, IEEE.

Le Roux et al., "A 1V RF SoC with an 863-to-928MHz 400kb/s Radio and a 32b Dual-MAC DSP Core for Wireless Sensor and Body Networks", Digest of Technical Papers, Feb. 2010, pp. 463-465, ISSCC 2010, Session 25, IEEE.

Wang et al., "A 5.5 nW Battery-Powered Wireless Ion Sensing System", ESSCIRC, Sep. 2017, pp. 364-367, IEEE.

Mercier et al., "A Sub-nW 2.4 GHz Transmitter for Low Data-Rate Sensing Applications", IEEE Journal of Solid-State Circuits, Jul. 2014, pp. 1463-1474, vol. 49, No. 7, IEEE.

Wang et al., "A Battery-Powered Wireless Ion Sensing System Consuming 5.5 nW of Average Power", IEEE Journal of Solid-State Circuits, Jul. 2018, pp. 2043-2053, vol. 53, No. 7, IEEE.

Wang et al. "Design Considerations of Ultralow-Voltage Self-Calibrated SAR ADC", IEEE Transactions on Circuits and Systems—II: Express Briefs, Apr. 2015, pp. 337-341, vol. 62, No. 4, IEEE.

PCT Search Report from the corresponding International Patent Application No. PCT/US2019/013591, dated Mar. 15, 2019.

PCT Written Opinion from the corresponding International Patent Application No. PCT/US2019/013591, dated Mar. 15, 2019.

* cited by examiner

LOW POWER TRANSMITTER OSCILLATOR CIRCUITS AND METHODS

PRIORITY CLAIM AND REFERENCE TO RELATED APPLICATION

The application claims priority under 35 U.S.C. § 119 and all applicable statutes and treaties from prior U.S. provisional application Ser. No. 62/617,356, which was filed Jan. 15, 2018.

FIELD

A field of invention is low power transmitter devices, and particularly efficient, low power oscillators that have very short start-up time. Another field of the invention is sensor systems that use low power transmitters, such as bio-sensing systems. Example applications of the invention include wireless modules in wearable or implanted devices, low-power wireless sensors and sensor systems, and high-frequency clock generators.

BACKGROUND

Wireless sensing systems have countless possible applications. The wireless sensing systems present a challenge in terms of powering the sensor. Either a long battery life or energy harvesting is generally required. Therefore, it is important to reduce the average power of the systems. Gregory Chen, et al., Gregory Chen, Hassan Ghaed, Razi-ul Haque, Michael Wieckowski, Yejoong Kim, Gyouho Kim, David Fick, Daeyeon Kim, Mingoo Seok, Kensall Wise, David Blaauw, Dennis Sylvester, "A Cubic-Millimeter Energy-Autonomous Wireless Intraocular Pressure Monitor", in Proc. IEEE International Solid-State Circuits Conference (ISSCC), February 2011. A. Fazli Yeknami, X. Wang, S. Imani, A. Nikoofard, I. Jeerapan, J. Wang, P. P. Mercier, "A 0.3V Biofuel-Cell-Powered Glucose/Lactate Biosensing System Employing a 180 nW 64 dB SNR Passive $\Delta\Sigma$ ADC and a 920 MHz Wireless Transmitter," in Proc. IEEE International Solid-State Circuits Conference (ISSCC), February 2018.

In general, local base stations such as a cell phone or smart watch are employed near the wireless sensing nodes, so that the sensing system can communicate over a short distance in order to reduce the required active power of the transmitter. However, even under low path-loss constraints, RF circuits still often dominate the power consumption of the system. Thus, reduce the required power and increase the power efficiency of the transmitter is very important. S. B. Lee, H.-M. Lee, M. Kiani, U.-M. Jow, and M. Ghovanloo, "An inductively powered scalable 32-channel wireless neural recording system-on-a-chip for neuroscience applications," IEEE Trans. Biomed. Circuits Syst., vol. 4, no. 6, pp. 360-371, November 2010. E. Le Roux, N. Scolari, B. Banerjee, C. Arm, P. Volet, D. Sigg, P. Heim, J.-F. Perotto, F. Kaess, N. Raemy, A. Vouilloz, D. Ruffieux, M. Contaldo, F. Giroud, D. Severac, M. Morgan, S. Gyger, C. Monneron, T.-C. Le, C. Henzelin, and V. Peiris, "A 1 V RF SoC with an 863-to-928 MHz 400 kb/s radio and a 32 b dual-MAC DSP core for wireless sensor and body networks," in 2010 IEEE ISSCC Dig. Tech. Papers, February 2010, pp. 464-465.

For deeply duty-cycled TXs, both the active and standby power are critical. Reduced startup time can greatly increase the data rate and reduce the active power for 1 bit data transmission. This problem is especially important for low-supply wireless sensing systems since the transconductance of the cross-coupled transistors are small. H. Wang, X. Wang, J. Park, A. Barfidokht, J. Wang, P. P. Mercier, "A 5.5 nW Battery-Powered Wireless Ion Sensing System," in Proc. IEEE European Solid-State Circuits Conference (ESS-CIRC), September 2017. P. P. Mercier, S. Bandyopadhyay, A. C. Lysaght, K. M. Stankovic, A. P. Chandrakasan, "A Sub-nW 2.4 GHz Transmitter for Low Data-Rate Sensing Applications," IEEE J. of Solid-State Circuits (JSSC), vol. 49, no. 7, pp. 1463-1474, July 2014. H. Wang, X. Wang, A. Barfidokht, J. Park, J. Wang, P. P. Mercier, "A Battery-Powered Wireless Ion Sensing System Consuming 5.5 nW of Average Power", IEEE J. of Solid-State Circuits (JSSC), vol. 53, no. 7, pp. 2043-2053, July 2018.

The active power of the TX has three parts: static bias power of cross-coupled transistor, power dissipated on antenna and power dissipated on the parasitic resistance. Most of the conventional TXs are working in class A or class AB mode, which consumes significant amounts of static bias power.

SUMMARY OF THE INVENTION

A preferred embodiment provides a fast startup power oscillator transmitter that includes a transistor pair that drives a resonant circuit including a tunable capacitance. A capacitor array forms the tunable capacitance. A voltage booster activates the capacitor array. A clamped body bias voltage booster can set the body bias voltage of the transistor pair. Control circuitry activates the resonant circuit through a triode-mode switch in response to an input in a range of 0.3-0.6V, preferably while controlling the substrate bias voltage of the transistor pair to increase transconductance of the cross-coupled transistor pair. In a variation, a control circuit pushes a top plate voltage of one of the two capacitors to $^2V_{DD}$ and pulls the top plate voltage of the other to zero to give the oscillator an initial condition. In a variation, a shaped pulse drives the transistor pair to switch to a class D oscillator mode, and the triode mode switch transistor is only turned on when the oscillation signal voltage is in the range of 0.3-0.6V.

DETAILED DESCRIPTION OF THE PREFERRED EMBODIMENTS

Preferred methods and circuits can significantly improve the power efficiency and greatly reduce the start-up time of the power oscillator in a low power transmitter. Preferred embodiments can reduce the power requirement compared to state-of-the-art low power oscillators by nearly half, and power oscillators of the invention can start up with nearly no startup time. In one aspect of the invention, power efficiency and start up are improved via low supply transmission (TX) gate biasing control: by controlling the substrate bias voltage of the TX cross-coupled devices, the transconductance is greatly improved, therefore improve the energy efficiency and startup time In another aspect of the invention, a fast startup power oscillator is achieved via a switch-capacitor circuit to give the power oscillator an initial condition (a voltage difference of preferably at least 1.5 and more preferably 2 times (or about 2 times, e.g., 1.8 to 2.2 times) supply voltage across the antenna) to help it start up immediately. In another aspect of the invention, an energy-efficient power oscillator is provided by avoiding typical cascading of two single-stage amplifiers which use an LC tank as the load and use the outputs to drive the gate of each other directly. Instead, in preferred embodiments, the output of one amplifier is rectified and pulse-shaped, then used to drive the gate of another, which greatly improves the power efficiency. An example power oscillator of the invention can, for example, be used to provide a power oscillator in a 0.30-0.40V Biofuel-Cell-Powered Glucose/Lactate Biosensing System. More generally, the preferred oscillators perform well at 0.30-0.60V.

Preferred methods of the invention include boosting the transmitter gate drive voltage to reduce switch ON resistance while also adjusting bias body voltage to increase transconductance, which helps increase the headroom and overdrive of the bias transistors. Preferred methods include providing the power oscillator an initial condition of a voltage difference at least 1.5 and preferably about 2 times a supply voltage across the antenna). Preferred method include rectifying and pulse-shaping the output of one amplifier and uses the rectified and pulse shaped to drive the gate of another amplifier Preferred embodiments of the invention will now be discussed with respect to the drawings and experiments used to demonstrate the invention. The drawings may include schematic representations, which will be understood by artisans in view of the general knowledge in the art and the description that follows. Features may be exaggerated in the drawings for emphasis, and features may not be to scale.

A preferred embodiment is a self-powered wireless physiochemical sensing system for monitoring of glucose or lactate in bodily fluids. The preferred embodiment demonstrates a preferred fast startup power oscillator of and a low-power transmitter, and artisans will recognize broader features of the invention from the self-powered wireless physiochemical sensing system. The sensing system has been demonstrated experimentally. In the experimental system, a biosensor chip consisted of a duty-cycled biofuel cell (BFC) maximum power point tracker analog front-end, a passive ΔΣ ADC, an RF power oscillator transmitter using a 1 cm external loop antenna, digital data storage, and timing and clock generation circuitries, all designed to operate from the dynamic 0.3V BFC output voltage. The on-chip circuitry was implemented in 65 nm CMOS, and exclusively powered via an enzymatic biofuel cell, and was demonstrated to successfully detect changes in glucose/lactate concentration between 2.5-15 mM. The experimental system demonstrated an integrated self-powered chemical biosensing system with digital wireless readout via the low power oscillator, and the entire sensor with the low power oscillator consumed an average power of 1.15 µW.

Figure 1A:
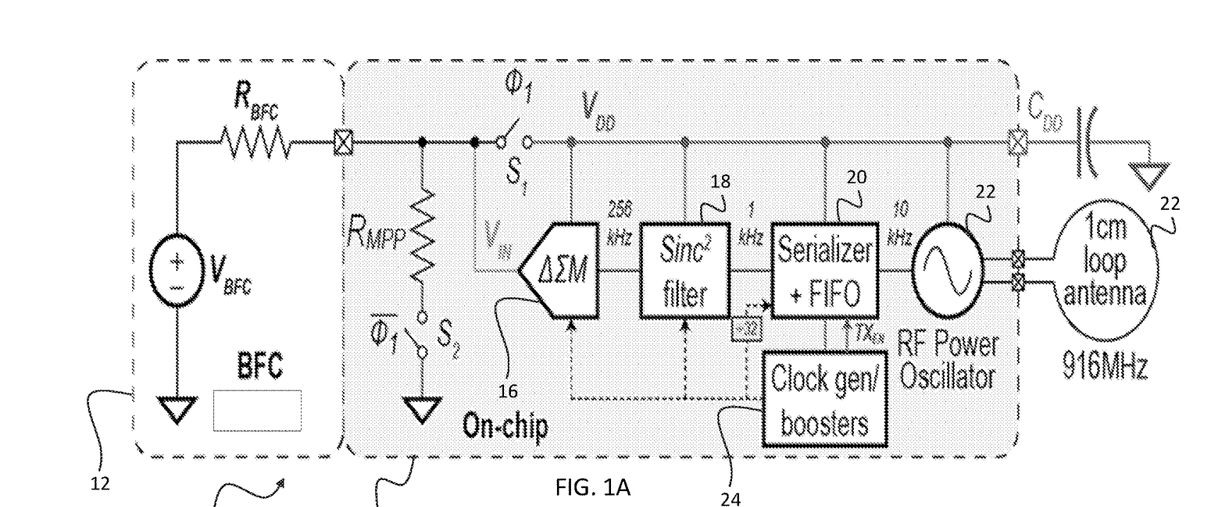
FIG. 1A illustrates a self-powered biosensing system that includes a low-power transmitter oscillator of the invention.
Figure 1B:
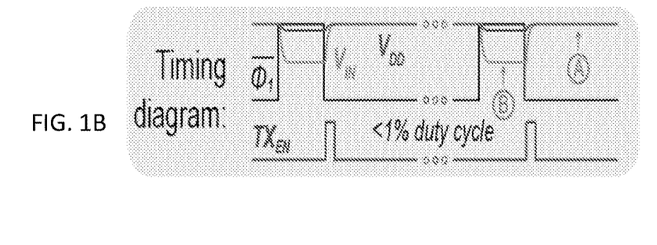
FIG. 1B shows a timing diagram of the system.

FIG. 1A illustrates a preferred embodiment low power oscillator transmitter as part of a self-powered biosensing system 10, and FIG. 1B shows a timing diagram of the system 10. The biosensing and data conversion portions of the system are illustrated to show an example system that operates with very low voltage. A BFC 12 is used directly as a voltage source to power the system 10 without any DC-DC converter, with the power being supplied to on-chip electronics 14. The BFC 12 can be any device that is capable of providing energy from electrochemical reactions with the analyte of interest, e.g., glucose or lactate. At steady state, the BFC 12 passes current through switch $S_1$ during phase $\varnothing_1$ to establish $V_{DD}$, which is near the open-circuit voltage of the BFC, as the circuit is in a low-power sleep state for the majority of phase $\varnothing_1$. Since continuously presenting a matched load at the maximum power point (MPP) depletes fuel at the maximum possible rate, limiting longevity, the system instead only presents a matched load, $R_{MPP}$, at a 1% duty ratio via periodic activation of switch $S_2$ during phase $\overline{\varnothing_1}$. During phase $\overline{\varnothing_1}$, the system is sustained by a 1 µF 1×0.5 mm² ceramic decoupling capacitor, $C_{DD}$. The matched resistor, $R_{MPP}$, is implemented on-chip as a 3-bit binary weighted resistance, with resistance ranging from 30Ω to 200Ω, a suitable range for the BFCs tested experimentally. During phase $\overline{\varnothing_1}$, a passive ΔΣ converter 16 samples and digitizes VIN, which drops according to the MPP and applied resistance. A sinc² filter 18 serializes the data from the ΔΣ analog-to-digital converter 16. The data is buffered in a serial FIFO register 20. An integrated on-chip wireless transmitter/RF power oscillator 22 excites an antenna (off chip) to transmit the data. Boost electronics 24 provides for energy efficiency and fast start-up of the RF power oscillator 22.

ΔΣ analog-to-digital converter 16.

Since the energy available from the glucose/lactate BFC harvester is limited and its open-circuit voltage is very low (0.3-0.5V), the ADC 16 should operate under as low as 0.3V and consume ultra-low power. Traditional ΔΣ ADCs largely depend on power-expensive op-amps, and thus traditional ΔΣM circuits are not practical at 0.3V. The ΔΣ ADC should include a passive integrator. Details about the ADC and the sensing system that generates data for transmission can be found in Mercier, Wang et al. "0.3-V CMOS Biofuel-Cell-Powered Wireless Glucose/Lactate Biosensing System," IEEE Journal of Solid-State Circuits, Vol. 53, No. 11 (November 2018).

Low-Power Transmitter/RF Power Oscillator 22

With continued reference to FIG. 1A, output bits from the ΔΣM 16 are passed through the sinc² decimation filter 18 and stored in the FIFO 20 until the power oscillator transmitter 22 is activated. Oscillator transmitters are typically used in low power wireless systems these types of transmitters have low complexity and low leakage power, which is particularly important for applications where the transmitter has a short active time and a low average data rate. With the very low voltage 0.3 that is an operational requirement in the example BFC powered system, typical oscillator transmitters would perform poorly due to switch ON conductance and reduced transistor transconductance, $g_m$. To cope with these challenges, tail current sources [P. P. Mercier, S. Bandyopadhyay, A. C. Lysaght, K. M. Stankovic, A. P. Chandrakasan, "A Sub-nW 2.4 GHz Transmitter for Low Data-Rate Sensing Applications," *IEEE J. of Solid-State Circuits* (JSSC), vol. 49, no. 7, pp. 1463-1474, July 2014] are replaced by binary-weighted cross-coupled pairs in [H. Wang, X. Wang, J. Park, A. Barfidokht, J. Wang, P. P. Mercier, "A 5.5 nW Battery-Powered Wireless Ion Sensing System," in Proc. IEEE European Solid-State Circuits Conference (ESSCIRC), September 2017] to maximize $V_{GS}$ and $g_m$ of the cross-coupled input devices, though in that case at a 0.6V supply. When the supply voltage goes down further and below threshold voltage both $g_m$ and ON conductance become very small, and thus, extremely large devices are required to satisfy the start-up condition, which increases parasitic capacitance and thereby reduces the effective possible size of the radiating/resonant inductive antenna.

Figure 2A:
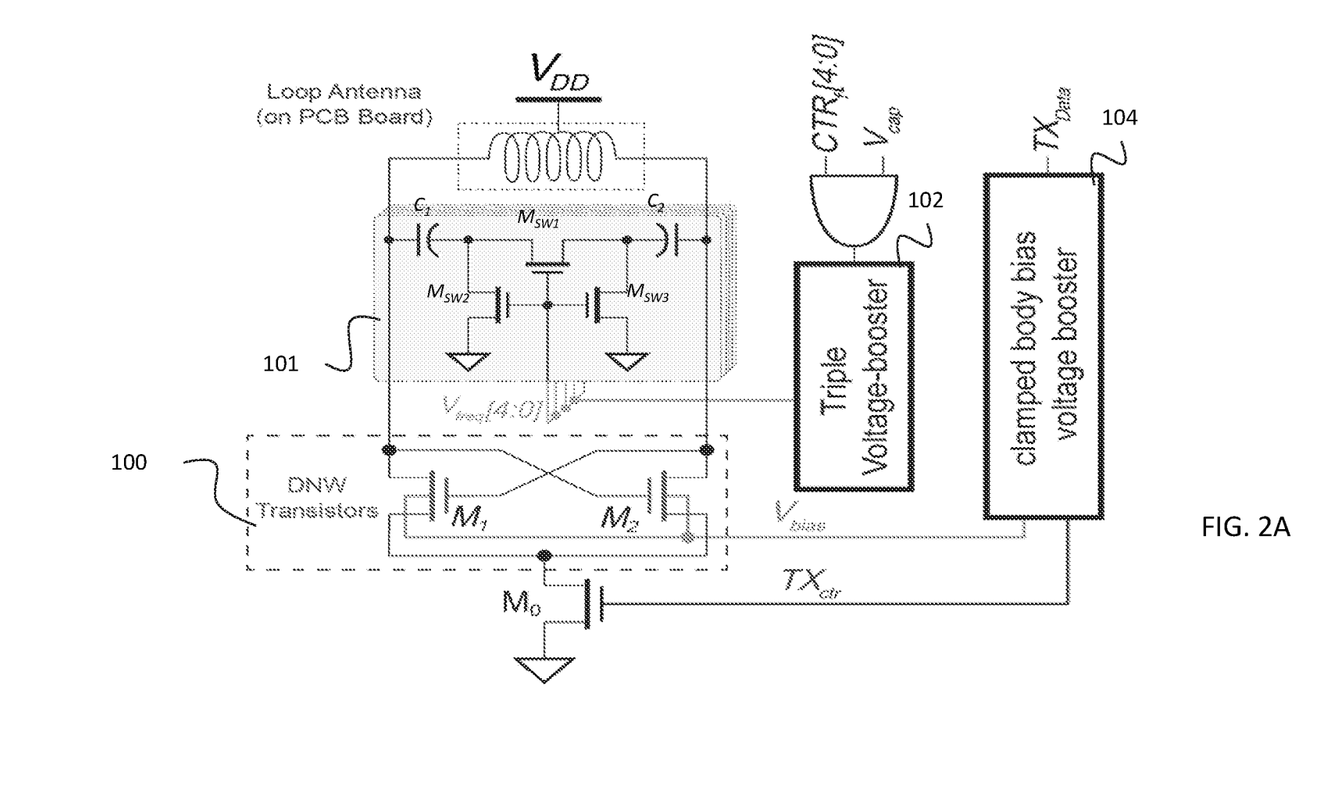
FIG. 2A shows a preferred power oscillator transmitter for FIG. 1A

The preferred design to meet even lower voltages is shown in FIG. 2A, and uses cross-coupled transistor antenna driving pair 100 and frequency tuning capacitor layers 101. Cross-coupled input driving pair 100 including transistors $M_{1,2}$. Deep N-well (DNW) transistors $M_1$ and $M_2$ are used in the cross-coupled transistor pair 100 so that their body bias voltage can be adjusted. In the example, there five bits, and 5 frequency tuning capacitive layers 101 are shown. Each of layers 101 includes a set of frequency tuning capacitors ($C_1$ and $C_2$) and switches ($M_{SW1-3}$) which control whether or not the current layer will be connected to the frequency tuning capacitor array. In addition, $M_0$ provides a triode-mode switch to control the on and off the power oscillator, which greatly reduces the $V_{DS}$ of $M_0$ and increases the VGS of $M_1$ and $M_2$, thereby increase the transconductance of $M_1$ and $M_2$.

Figure 2B:
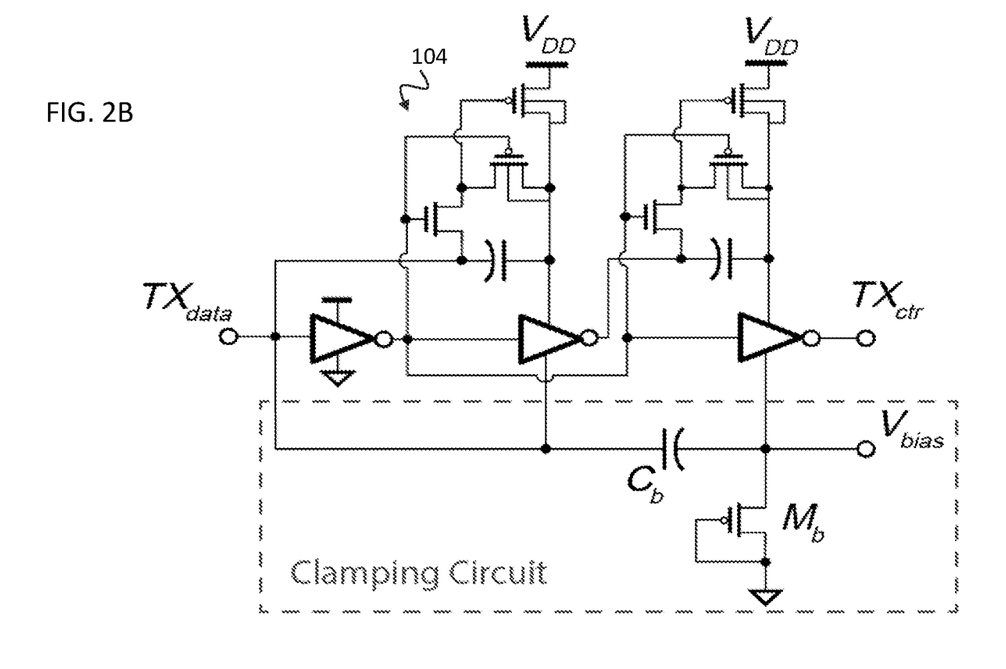
FIG. 2B shows the preferred circuit for the clamped body bias booster circuit.
Figure 2C:
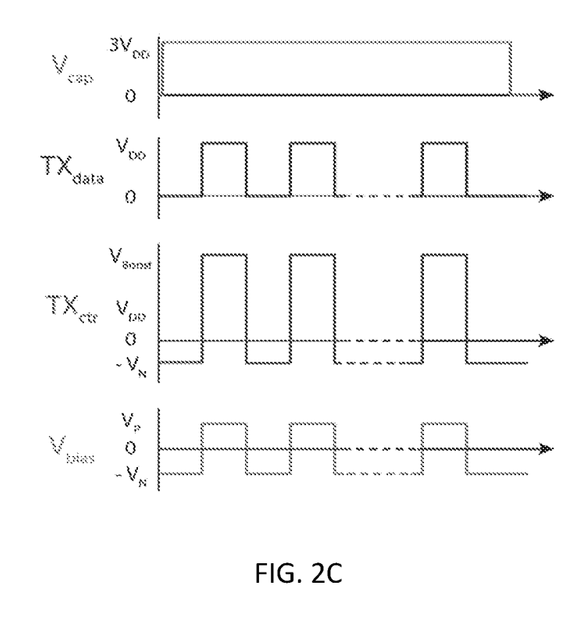
FIG. 2C shows example waveforms for the power oscillator transmitter.

The FIG. 2A transmitter is a single-stage direct-RF OOK-modulated power oscillator (RFPO). Impedance matching is provided for the antenna, for example the transmitter provides inherent impedance matching with a 1 cm 920 MHz on-board loop antenna. While sufficient at 0.6V without boost, lowering further even to 0.4V causes the gates of the cross-coupled input pair, $M_{1,2}$, to be insufficiently driven. Boosting the gate voltage can reduce the switch ON resistance and loss, but the low $g_m$ issue must still be resolved. To address these issues, the preferred embodiment transmitter includes a triple voltage booster 102 and a clamped body bias voltage booster 104. The triple voltage booster 102 boosts the gate driving voltage of $M_{SW1}$-$M_{SW3}$ to reduce RON. The direct-RF power oscillator with the clamped body bias booster circuit 104 was demonstrated to increase the $g_m$ at 0.3-0.4V, which improves the $g_m$ of cross-coupled pair 100 by 29.6% and reduces the startup time by 48%. FIG. 2B shows the preferred circuit for the clamped body bias booster circuit 104. Example control signals in the TX are shown in FIG. 2C. The clamped bias voltage booster circuit has been used for boosting the body voltage of the NMOS transistors in a sampling switch, and is described in X. Wang, H. Huang, and Q. Li, "Design considerations of ultralow voltage self-calibrated SAR ADC," *IEEE Trans. Circuits Syst. II, Exp. Briefs*, vol. 62, no. 4, pp. 337-341, April 2015

Prior to data transfer from the FIFO 20 to the TX/oscillator 22 (FIG. 1A, also see FIG. 2A), the capacitors in each layer of the 5-bit layer array 101 are activated by corresponding 3× voltage booster 102 layers to minimize the switch ON resistance and loss. The value of the capacitance connected to the LC tank (antenna 22 plus connected capacitance from 101) is set by a 5-bit control code $CTR_f$ [4:0]. When $TX_{data}$ goes high, $TX_{ctr}$ is boosted via the 3× clock boosting circuit 102 to drive $M_0$ into triode mode, decreasing the ON resistance of $M_0$ by 94%. This helps increase the headroom and overdrive of $M_{1,2}$. To further increase $g_m$ of the input pair, the clamped clock boosting circuit 104 is used to set the body bias voltage, $V_{bias}$, to a positive potential. In FIG. 2B, capacitor $C_b$ and diode-connected transistor, $M_b$, form a high-pass filter. When $TX_{data}$='1', $V_{bias}$ is near threshold voltage of clamping transistor $M_b$ (FIG. 2B) due to the high resistance of $M_b$ in the cutoff region, therefore increasing $g_m$ of $M_{1,2}$ by 29.6% and decreasing the start-up time by 48%. Leakage currents can cause a slow voltage droop, which potentially affects the performance. However, the voltage droop speed is only 2 mV/µs (for $C_b$=46fF), according to simulation results, which makes the effect negligible as the TX data rate is >1 Mbps.

The extra gate driving strength of $M_{1,2}$ also minimizes the device size and parasitic capacitance by 75.5% iso-current, enabling a 0.7 mm larger antenna diameter while maintaining resonance at 920 MHz. At the falling edge of $TX_{data}$, $V_{bias}$ is set to a negative value about $V_{th}$-$V_{DD}$, which drives $M_0$ into super-cutoff region, and thus, helps reduce the OFF leakage by 92%. Deep N-well transistors are used for $M_1$ and $M_2$ so that the body voltage can be adjusted without affecting other parts of the circuits. Given the rapid start-up time, the TX is preferably deeply duty-cycled, and activated once every 14.3 ms. When $TX_{data}$ is "0", $TX_{ctr}$ is set to "0", which turns $M_0$ off and thus the TX is disabled and placed in a low-leakage state.

Figure 2D:
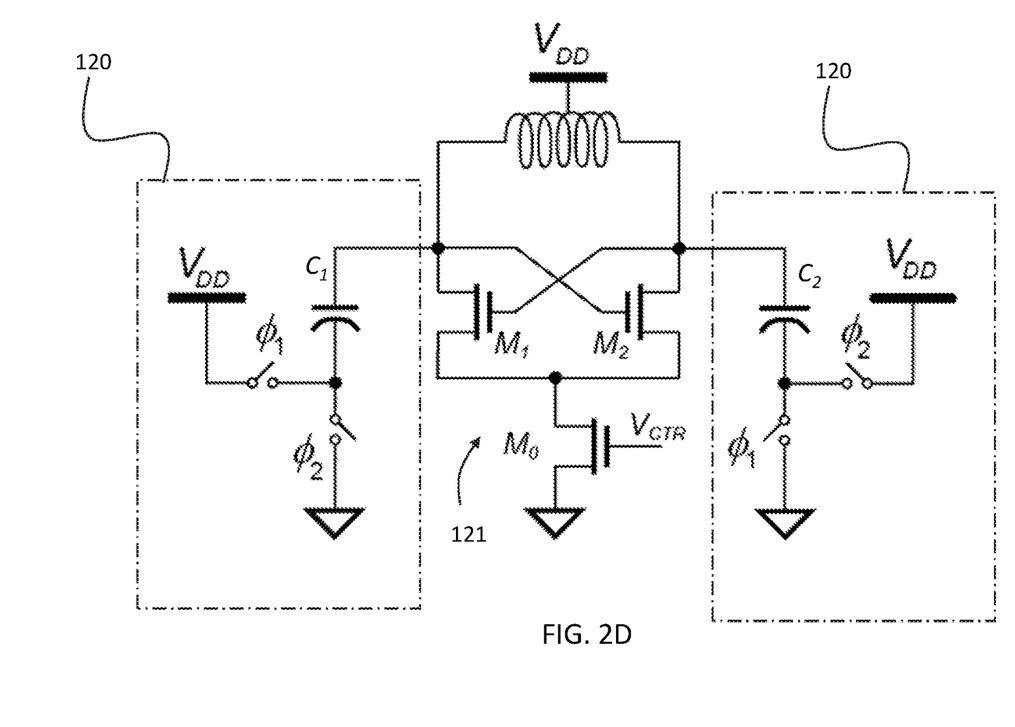
FIGS. 2D-2J show additional low-power oscillator transmitters and and control operations.

FIG. 2D shows a fast-start up circuit 120 that can be used to provide an initial condition to the oscillator and is an alternative to 101 in FIG. 2A. A driver 121 is formed with pair of cross-coupled transistors $M_{1-2}$ are used to drive the antenna. $M_0$ works as a triode-mode switch to turn on and off the power oscillator. Compared to the previous architecture in FIG. 2A, each capacitor 120 is connected to two switches which are connected to the power supply and ground, respectively. A voltage of $2V_{DD}$ is generated in the architecture in FIG. 2D to provide an initial condition. In FIGS. 2D-2I, one layer is shown for simplicity, i.e., in FIG. 2D features 120 and 121 are one layer but represent multiple layers in preferred embodiments as in FIG. 2A. 120 in FIG. 2D is similar to layers 101 and the booster 102 in FIG. 2. In FIG. 2A, multiple layers 101 tune the resonant frequency to the desired value by changing the value of capacitors connected to the LC tank. In FIG. 2D it is assumed that the resonant frequency is the desired value so that the multiple tuning layers are not shown for simplicity. Multiple layers can also be used in 120 for frequency tuning, however, as will be appreciated by artisans.

Figure 2E:
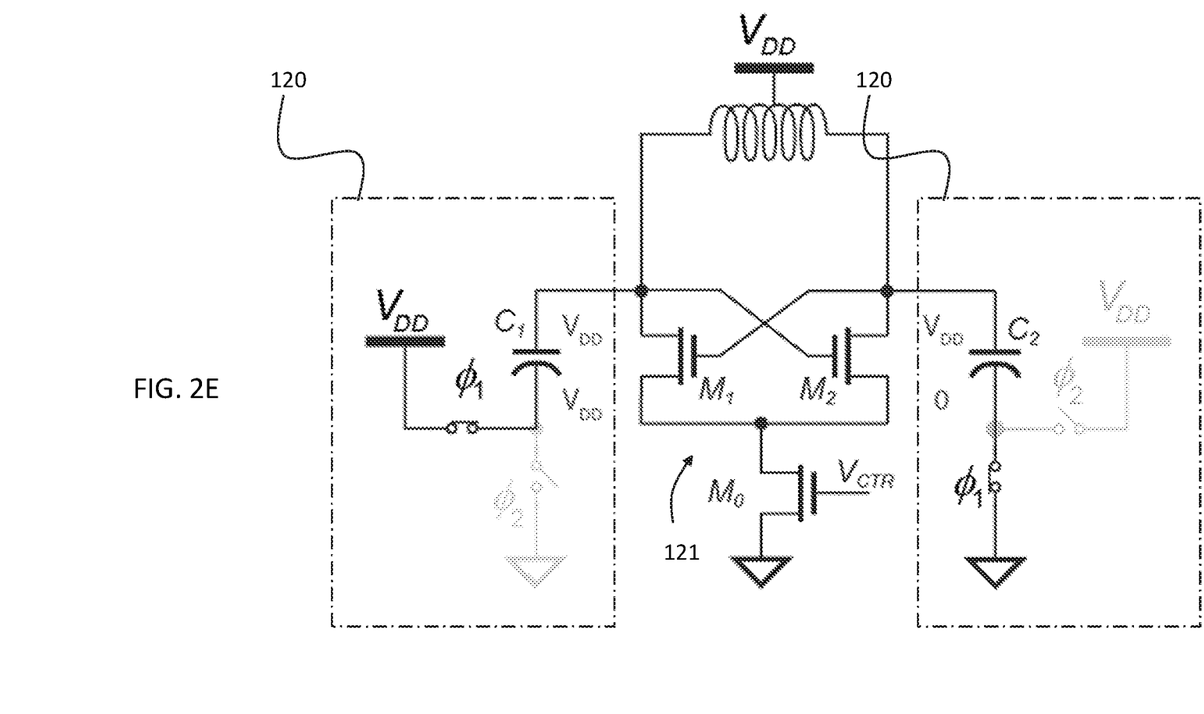
Figure 2F:
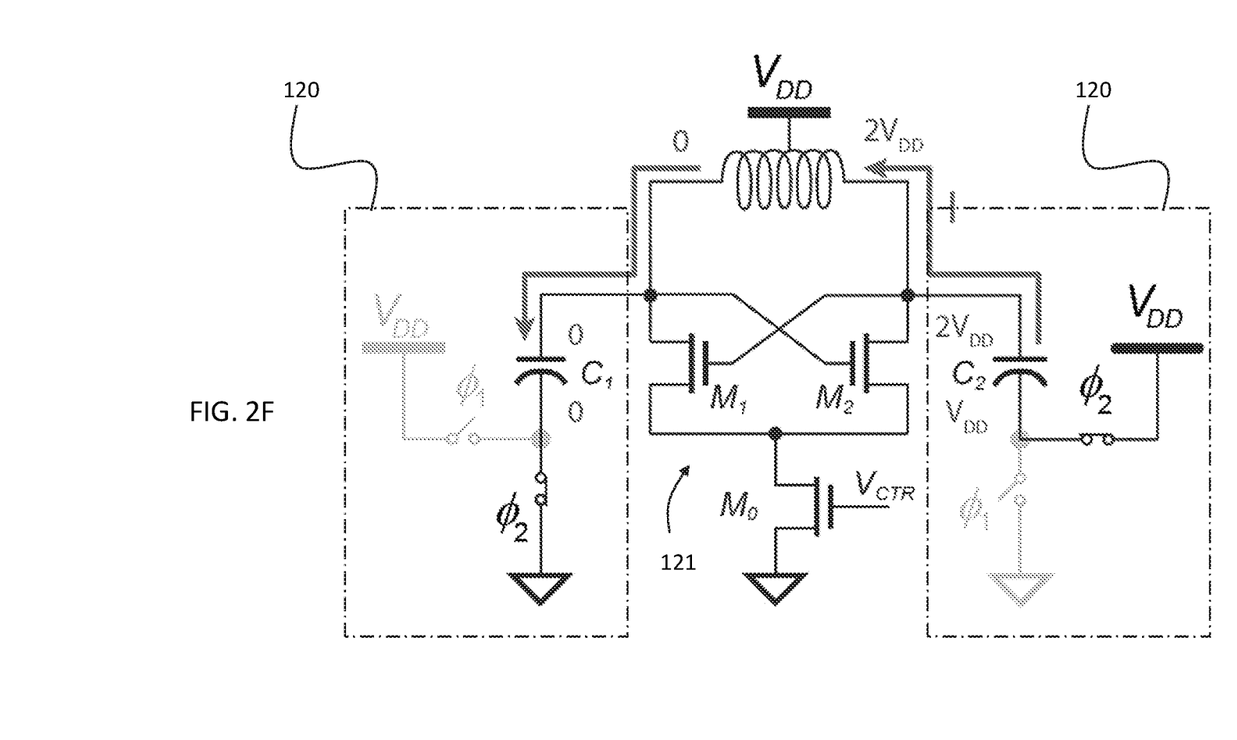
Figure 2G:
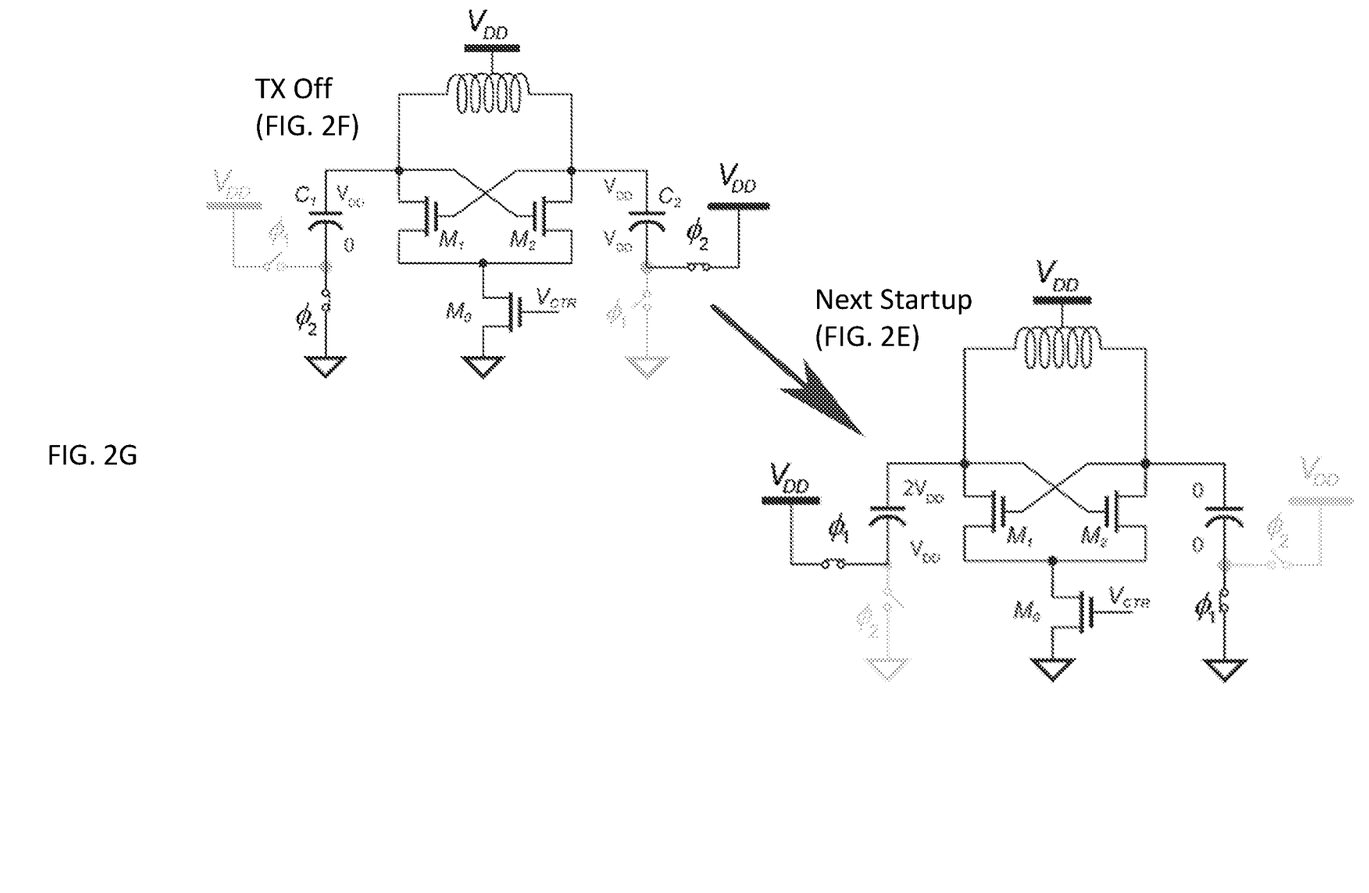

FIG. 2E shows an initial state of the circuit of FIG. 2D. This is a pre-charge phase. In the pre-charge phase, $C_2$ is charged to $V_{DD}$ and $C_1$ is purged. A second phase is shown in FIG. 2F, which involves the voltage push and pull. During this phase, the bottom plate connections of $C_1$ and $C_2$ are switched. The top plate voltage of $C_2$ is boosted to $2V_{DD}$ and the top plate voltage of $C_1$ is pulled to zero volts. FIG. 2G shows that the connection of FIG. 2F is maintained until the next startup, which then switches back to FIG. 2E.

Figure 2H:
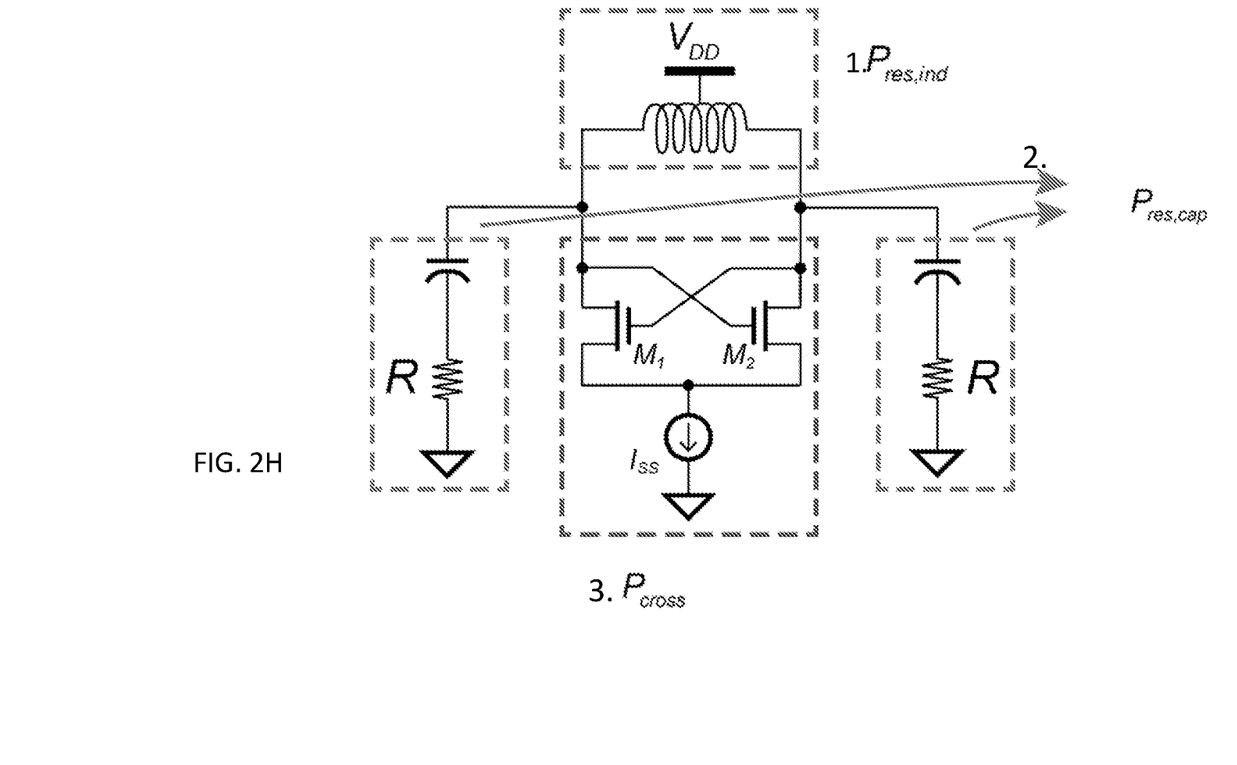

FIG. 2H illustrates the power dissipation during transmission. Power in portion 1 is dissipated through the parasitic resistance of the antenna inductor, labelled as $P_{res,ind}$. Power is dissipated in portion 2 through the switch on-resistance, labelled $P_{res,cap}$. Power is dissipated in portion 3 through the static power of the cross-coupled transistors, labelled as $P_{cross}$. The efficiency can be increased when the following steps are taken in portions 1-3. In portion 1, the antenna radiation power $P_{rad}=\eta P_{res,ind}$, where n is the radiation efficiency of the antenna. With a given antenna, the power $P_{res,ind}$ should be increased to increase the radiation power to transmit a stronger signal. In portion 2, $P_{res,cap}=I^2 \times R_{SW,cap}$, where I is the root mean square value of the current during resonant, and $R_{SW,cap}$ is the on-resistance of the switch connected to the bottom plate of the capacitor. The switch on-resistance can be reduced to reduce the power. In portion 3, the power can be reduced by reducing the supply voltage $V_{DD}$ or current $I_{SS}$. However, reducing $V_{DD}$ will reduce the maximum allowable swing, and thereby reduce the maximum radiation power, which is not desirable. The oscillation swing is proportional to $I_{SS}$ and reducing $I_{SS}$ will also reduce the maximum radiation power.

Figure 2I:
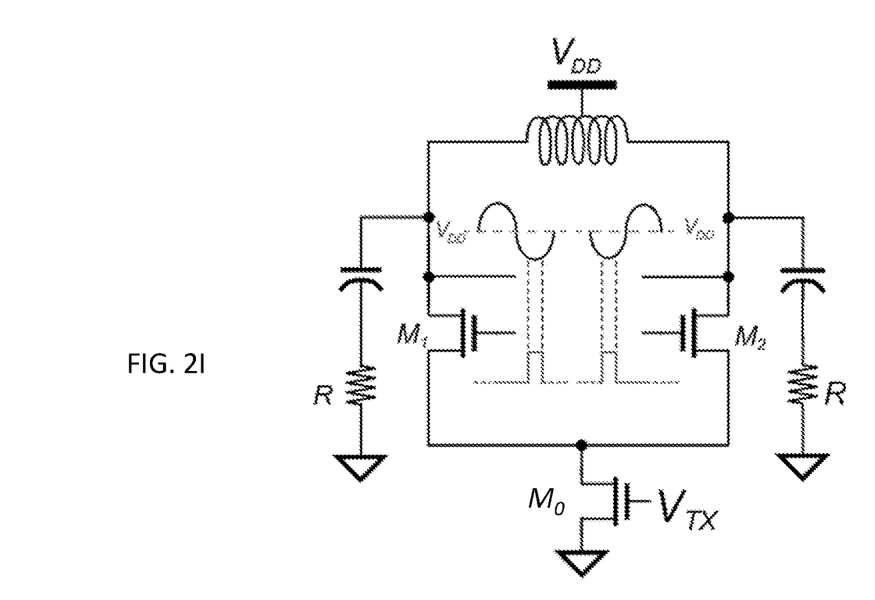
Figure 2J:
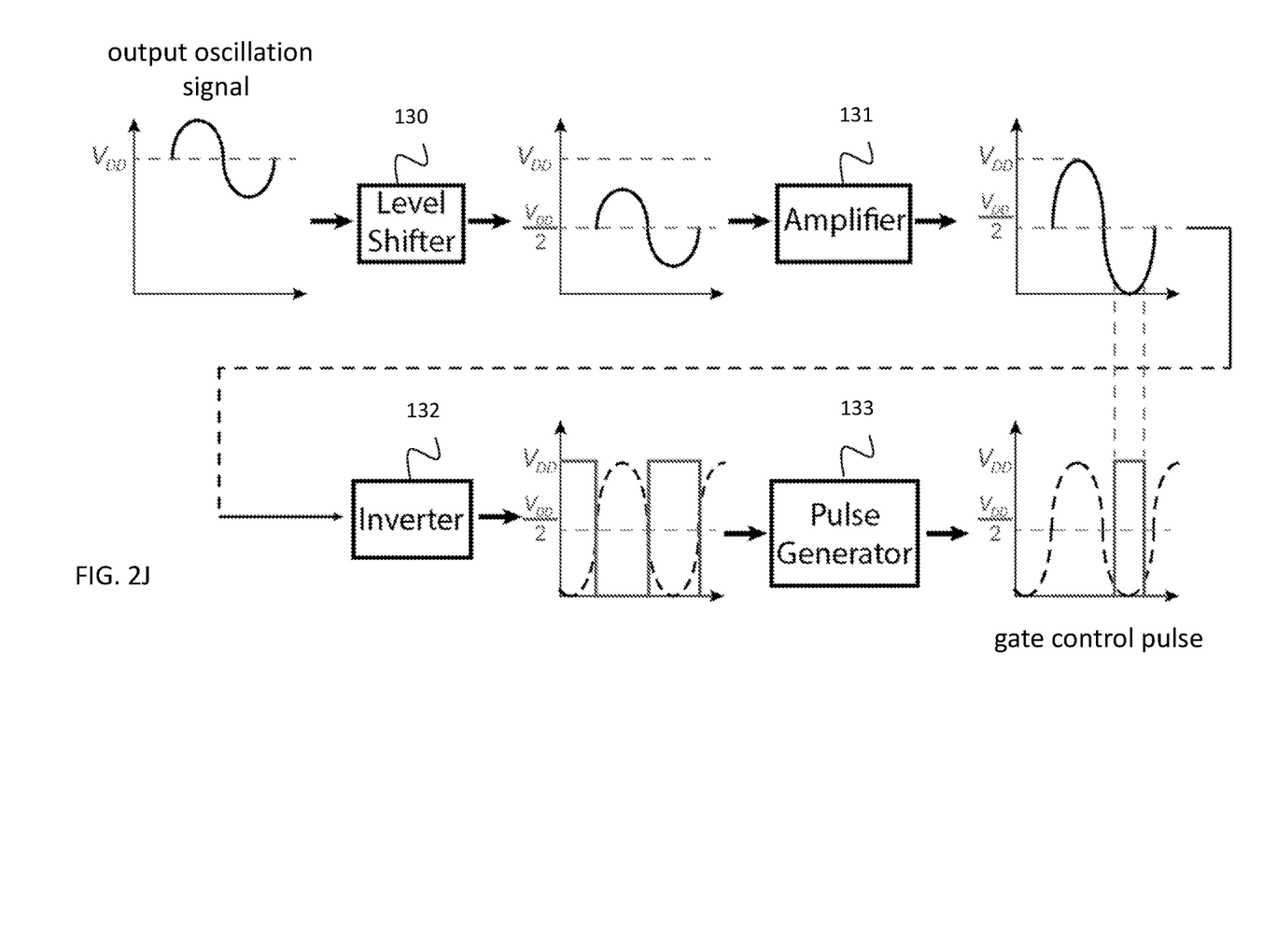

FIG. 2I illustrates a way of operation to increase the power efficiency of the transmitter. In FIG. 2A and FIG. 2D, the transistors $M_1$ and $M_2$ are cross-coupled to provide the negative resistance and drive the LC tank. But in FIG. 2I, the connection is changed, $M_1$ and $M_2$ are not cross-coupled. The shaped pulse is used to drive $M_1$ and $M_2$ in FIG. 2I, which is similar to M1 and M2 in FIG. 2A and FIG. 2D, but with a different connection. Basically, the power oscillator operation mode is changed to increase efficiency. The mode is switched to a class D oscillator mode, and the transmission transistor is only turned on when the oscillation signal voltage is low (usually less than 0.3 or 0.4 $V_{DD}$). In this way, the power consumption is reduced because: first, the power oscillator is only turned on for a small portion of the whole period; second, when the power oscillator is on, one of the transistors is off and the other's $V_{DS}$ is the same as the oscillation signal, which is small. Therefore, the product of $V_{DS}$ and $I_{SS}$ is small, which is portion 3 mentioned in the previous discussion, namely the power dissipated on the cross-coupled transistor pair. FIG. 2J shows a preferred to implement the class D operation. First, the average value of the output oscillation signal is shifted by a level shifter 120 from $V_{DD}$ to $V_{DD}/2$. Then an amplifier 131 amplifies its swing to full swing (0 to $V_{DD}$). The amplified signal is sent to an inverter 132 to transform the sinusoidal signal to a square signal. Then a pulse generator 133 is used to shape and control the duty cycle of the square signal while make it is "1" only when the oscillation signal amplitude is low. This output signal is used to drive the gate of the tail-switch transistor $M_0$ in FIG. 2I.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A fast startup power oscillator transmitter comprising:
    a transistor pair that drives a resonant circuit including a tunable capacitance;
    a voltage booster that activates the capacitance;
    and control circuitry to activate the resonant circuit through a triode-mode switch transistor driven in response to an input in a range of 0.3-0.6V.

2. The transmitter of claim 1, wherein the transistor pair comprises a cross-coupled transistor pair.

3. The transmitter of claim 2, wherein the capacitance includes a capacitor array that comprises:
    two switch-mode transistors and two capacitors, the control circuitry switching bottom plates of the two capacitors between a the power supply voltage $V_{DD}$ and ground, wherein during an initial condition, one of switch-mode transistors connects a bottom plate of a respective one of the two capacitors to GND and the other one of the two capacitors is switched to $V_{DD}$, and then bottom plate connections are switched to during a start phase to push a top plate voltage of one of the two capacitors to $2V_{DD}$ and pull the top plate voltage of the other to zero to give the oscillator an initial condition.

4. The transmitter of claim 1, wherein the control circuitry comprises a level shifter that shifts average voltage of an output signal to half $V_{DD}$;
    an amplifier that amplifies the output signal of the level shifter to full swing;
    an inverter that rectify the full swing sinusoidal signal to a square signal;
    a pulse generator that shape the square wave and control the duty cycle of the square signal.

5. The transmitter of claim 1, connected to an impedance matched antenna.

6. The transmitter of claim 1, wherein the control circuit comprises a plurality of amplifiers, wherein the output of one amplifier of the plurality is rectified and pulse-shaped, then drives the gate of another one amplifier of the plurality.

7. The transmitter of claim 1, wherein the control circuitry controls the tunable capacitance to provide an initial condition of a voltage difference at least 1.5 times a supply voltage across an antenna driven by the oscillator.

8. The transmitter of claim 7, wherein the voltage difference is 1.8 to 2.2 times the supply voltage.

9. The transmitter of claim 1, wherein the triode-mode switch transistor controls ON and OFF states of the transmitter.

10. The transmitter of claim 9, wherein the control circuitry reduces ON resistance of the transistor pair.

11. The transmitter of claim 1, wherein the capacitance comprises a capacitor array with a plurality of capacitor layers, each layer including a set of frequency tuning capacitors.

12. The transmitter of claim 1, wherein a shaped pulse drives the transistor pair to switch to a class D oscillator mode, and the triode mode switch transistor is only turned on when the oscillation signal voltage is in the range of 0.3-0.6V.

13. The transmitter of claim 1, wherein the capacitance comprises a capacitor array.

14. The transmitter of claim 1, further comprising a clamped body bias voltage booster to set the body bias voltage of the transistor pair, wherein the control circuitry controls the substrate bias voltage of the transistor pair to increase transconductance of the transistor pair.

15. The transmitter of claim 1, integrated on-chip in CMOS.

16. The transmitter of claim 15, wherein the transmitter consumes an average power of no more than ~1.15 µW.

* * * * *